United States Patent
Lee et al.

(10) Patent No.: US 8,035,108 B2
(45) Date of Patent: Oct. 11, 2011

(54) THIN FILM TRANSISTOR SUBSTRATE, LIQUID CRYSTAL DISPLAY PANEL INCLUDING THE SAME, AND METHOD OF MANUFACTURING LIQUID CRYSTAL DISPLAY PANEL

(75) Inventors: Seung Kyu Lee, Suwon-si (KR); Won Sang Park, Yongin-si (KR); Jae Hyun Kim, Suwon-si (KR); Yong Seok Cho, Seoul (KR); Yong Suk Yeo, Jecheon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 519 days.

(21) Appl. No.: 11/622,651

(22) Filed: Jan. 12, 2007

(65) Prior Publication Data
US 2007/0262315 A1    Nov. 15, 2007

(30) Foreign Application Priority Data
May 11, 2006  (KR) .................. 10-2006-0042595

(51) Int. Cl.
*H01L 27/14* (2006.01)
(52) U.S. Cl. ........... 257/72; 257/E23.064; 257/E31.126; 349/38; 349/40; 349/114
(58) Field of Classification Search .............. 349/114, 349/129, 38–113; 257/72, E23.064, E31.126
See application file for complete search history.

(56) References Cited

U.S. PATENT DOCUMENTS

| | | | |
|---|---|---|---|
| 2002/0093614 A1* | 7/2002 | Moon et al. | 349/141 |
| 2003/0030768 A1* | 2/2003 | Sakamoto et al. | 349/113 |
| 2003/0122990 A1* | 7/2003 | Kim | 349/43 |
| 2004/0105042 A1* | 6/2004 | Huang et al. | 349/44 |
| 2004/0109117 A1* | 6/2004 | Lee et al. | 349/129 |
| 2005/0110928 A1* | 5/2005 | Sonoda et al. | 349/114 |
| 2006/0092342 A1* | 5/2006 | Lee | 349/38 |

FOREIGN PATENT DOCUMENTS

| | | |
|---|---|---|
| CN | 1475841 | 2/2004 |
| CN | 1619402 | 5/2005 |
| CN | 1621900 | 6/2005 |

* cited by examiner

*Primary Examiner* — Matthew E Warren
*Assistant Examiner* — Fang-Xing Jiang
(74) *Attorney, Agent, or Firm* — F. Chau & Associates, LLC

(57) ABSTRACT

A liquid crystal display panel capable of preventing flicker and improving reflectance include a thin film transistor substrate having a gate line, a data line, a thin film transistor connected to the gate and data lines, and a reflective electrode connected to the thin film transistor and covering at least part of the gate line, a color filter substrate having a color filter and a common electrode forming an electric field with the reflective electrode. Liquid crystals are disposed between the thin film transistor substrate and the color filter substrate. The reflective electrode shields the liquid crystals from a gate signal.

8 Claims, 15 Drawing Sheets

THIN FILM TRANSISTOR SUBSTRATE, LIQUID CRYSTAL DISPLAY PANEL INCLUDING THE SAME, AND METHOD OF MANUFACTURING LIQUID CRYSTAL DISPLAY PANEL

BACKGROUND OF THE INVENTION

1. Technical Field

The present invention relates to a thin film transistor substrate, and more particularly, to a thin film transistor substrate capable of preventing flicker and improving reflectance, a liquid crystal display panel including the same, and a method of manufacturing the liquid crystal display panel.

2. Discussion of the Related Art

A liquid crystal display (LCD) device displays an image by using electrical and optical properties of liquid crystals. The LCD device includes an LCD panel for displaying an image through a pixel matrix, a driving circuit for driving the LCD panel, and a backlight unit for supplying light to the LCD panel. The LCD device is widely used ranging from small-sized display devices to large-sized display devices, such as mobile communication terminals, notebook computers, monitors and LCD TVs.

The LCD device may be classified according to a type of light source into a transmissive type using an internal light, a reflective type using an external light, and a transflective type using both the internal light and the external light. The transflective LCD device displays an image in a reflective mode if the external light is sufficient, and in a transmissive mode using a backlight unit if the external light is insufficient. Therefore, the transflective LCD device reduces power consumption and is not restricted to using external light.

The transflective LCD device has a structure in which a lower substrate 1 faces an upper substrate 11 with liquid crystal molecules 20 of an optically compensated bend (OCB) mode disposed therebetween, as illustrated in FIG. 1.

On the lower substrate 1, a reflective electrode 8 and a pixel electrode 10A of a first subpixel area face a pixel electrode 10B of a second subpixel with a gate line 4 disposed therebetween, the gate line being covered by an insulation layer 6.

A black matrix 2 separating the respective subpixel areas from each other, a color filter 16 formed in each subpixel area, an overcoat layer 14 having different thickness in a reflective area and a transmissive area, and a common electrode 12 forming a vertical electric field with respect to the pixel electrodes 10A and 10B and the reflective electrode 8, are formed on the upper substrate 11.

Due to an electric field formed between the common electrode 12 (or between the reflective electrode 8) and the gate line 4, an arrangement of the liquid crystal molecules 20 is changed, for example, inverted, at an edge of the reflective electrode 8 (or of the gate line 4). Since an arrangement of the liquid crystal molecules 20 at an edge of the reflective electrode 8 is different than in the other areas, light leakage occurs at the edge of the reflective electrode 8, resulting in flickering. Light leakage may be more severe in a line inversion scheme that supplies data voltages of different polarities to the adjacent pixel electrodes 10A and 10B with the gate line 4 disposed therebetween.

If the black matrix 2 is widened to partially overlap the first subpixel area so that an edge of the reflective electrode 8 can be blocked in order to prevent the light leakage, reflectance is lowered due to a decrease in an effective area of the reflective electrode 8.

SUMMARY OF THE INVENTION

Embodiments of the present invention provide a thin film transistor (TFT) substrate capable of preventing flicker and improving reflectance, an LCD including the same, and a method of manufacturing the LCD panel.

In accordance with an embodiment of the present invention, an LCD panel includes a TFT substrate including a gate line, a data line, a LCD connected to the gate line and data line, and a reflective electrode connected to the LCD and covering at least a part of the gate line, and a color filter substrate facing the thin film transistor substrate and including a color filter and a common electrode forming an electric field with the reflective electrode. Liquid crystals are disposed between the thin film transistor substrate and the color filter substrate. The reflective electrode shields the liquid crystals from a gate signal.

The LCD panel further includes a pixel electrode connected to the TFT.

The color filter substrate further includes an overcoat layer that has a first end and a second end overlapping the reflective electrode. The overcoat layer is formed on the color filter.

The TFT substrate further includes a storage electrode forming a first storage capacitor by insulatedly overlapping a drain electrode of the TFT, a first storage line connected to the storage electrode and adjacent to a first end of the gate line, and a second storage line that forms a second storage capacitor by insulatedly overlapping the pixel electrode. The second storage line is adjacent to a second end of the gate line.

The second storage line overlaps at least two pixel electrodes that are adjacent to each other in the direction of the length of the data line.

The TFT substrate further includes a shield pattern overlapping the data line and having a wider width than that of the data line.

The TFT substrate further includes a storage electrode forming a first storage capacitor by insulatedly overlapping a drain electrode of the TFT, a first storage line connected to the storage electrode and adjacent to a first end of the gate line, and a second storage line that forms a second storage capacitor by insulatedly overlapping the pixel electrode. The second storage line is adjacent to a second end of the gate line, wherein the shield pattern is electrically connected to the second storage line.

In accordance with an embodiment of the present invention, a TFT substrate includes a gate line formed on a substrate, a data line insulatedly crossing the gate line, a TFT connected to the gate and data lines, and a reflective electrode connected to the TFT and formed to cover at least a portion of the gate line to shield the gate line.

The second storage line is located between two pixel electrodes to which data signals having different polarities are supplied.

In accordance with an embodiment of the present invention, a method of manufacturing a LCD panel includes providing a TFT substrate including a gate line, a data line, a TFT connected to the gate line and data line, and a reflective electrode connected to the TFT and covering at least a portion of the gate line to shield the gate line, providing a color filter substrate including a color filter and a common electrode forming an electric field with the reflective electrode, and bonding the TFT substrate and the color filter substrate with liquid crystals disposed therebetween.

Providing the TFT substrate includes forming on the substrate the gate and data lines and the TFT connected to the gate and data lines, forming a passivation layer to cover the TFT, forming a pixel electrode connected to the TFT on the passivation layer, and forming the reflective electrode overlapping the gate line.

Providing the TFT substrate further includes forming, on the same plane and with the same metal as the gate line, a storage electrode forming a first storage capacitor by insulatedly overlapping a drain electrode of the TFT, a first storage line that is connected to the storage electrode and adjacent to a first end of the gate line, and a second storage line that forms a second storage capacitor by insulatedly overlapping the pixel electrode and is adjacent to a second end of the gate line.

Providing the TFT substrate further includes forming a shield pattern that overlaps the data line and has a wider width than that of the data line. The shield pattern is formed on the same plane and with the same metal as the gate line.

The shield pattern is electrically connected to the second storage line.

Providing the color filter substrate includes forming the color filter on the substrate, forming on the color filter an overcoat layer that has a first and a second end overlapping the reflective electrode, and forming the common electrode on the substrate on which the overcoat layer is formed.

BRIEF DESCRIPTION OF THE DRAWINGS

Exemplary embodiments of the present invention will become more apparent from the following detailed description taken in conjunction with the accompanying drawings in which.

DETAILED DESCRIPTION OF EXEMPLARY EMBODIMENTS

Exemplary embodiments of the present invention will now be described with reference to the attached drawings. This invention may, however, be embodied in many different forms and should not be construed as limited to the embodiments set forth herein.

Figure 1:
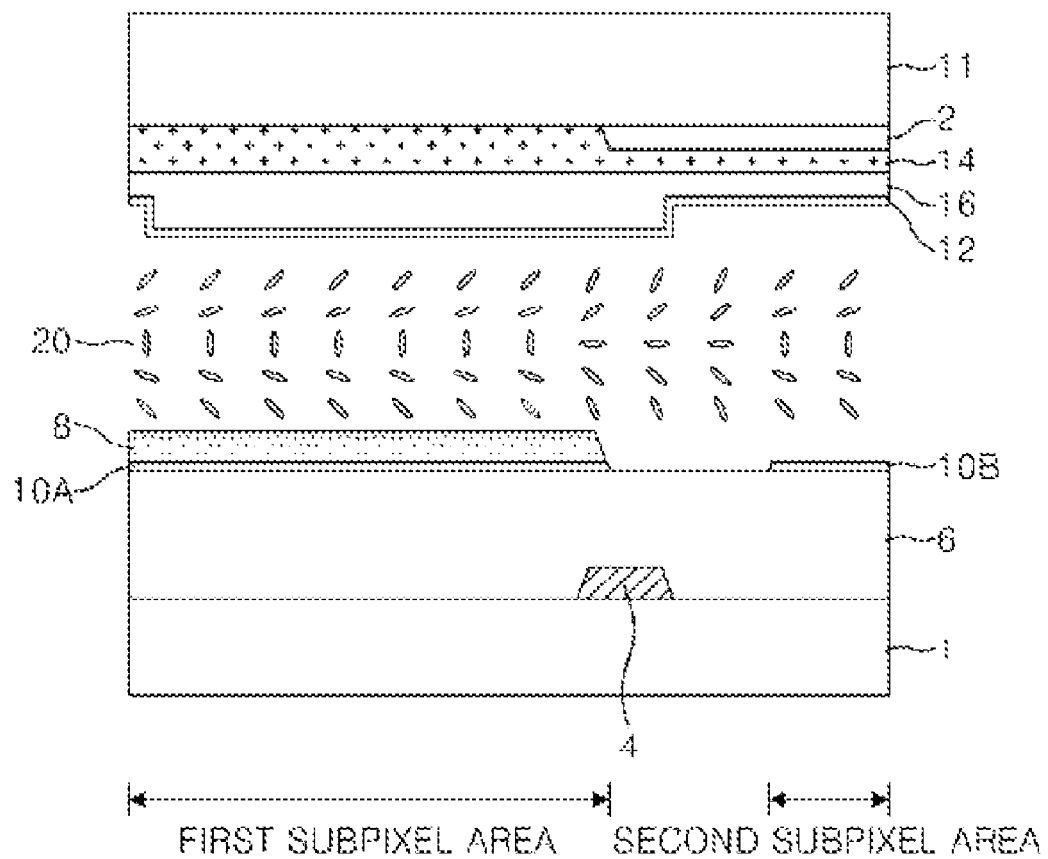
FIG. 1 is a cross-sectional view illustrating a conventional transflective LCD panel.
Figure 2:
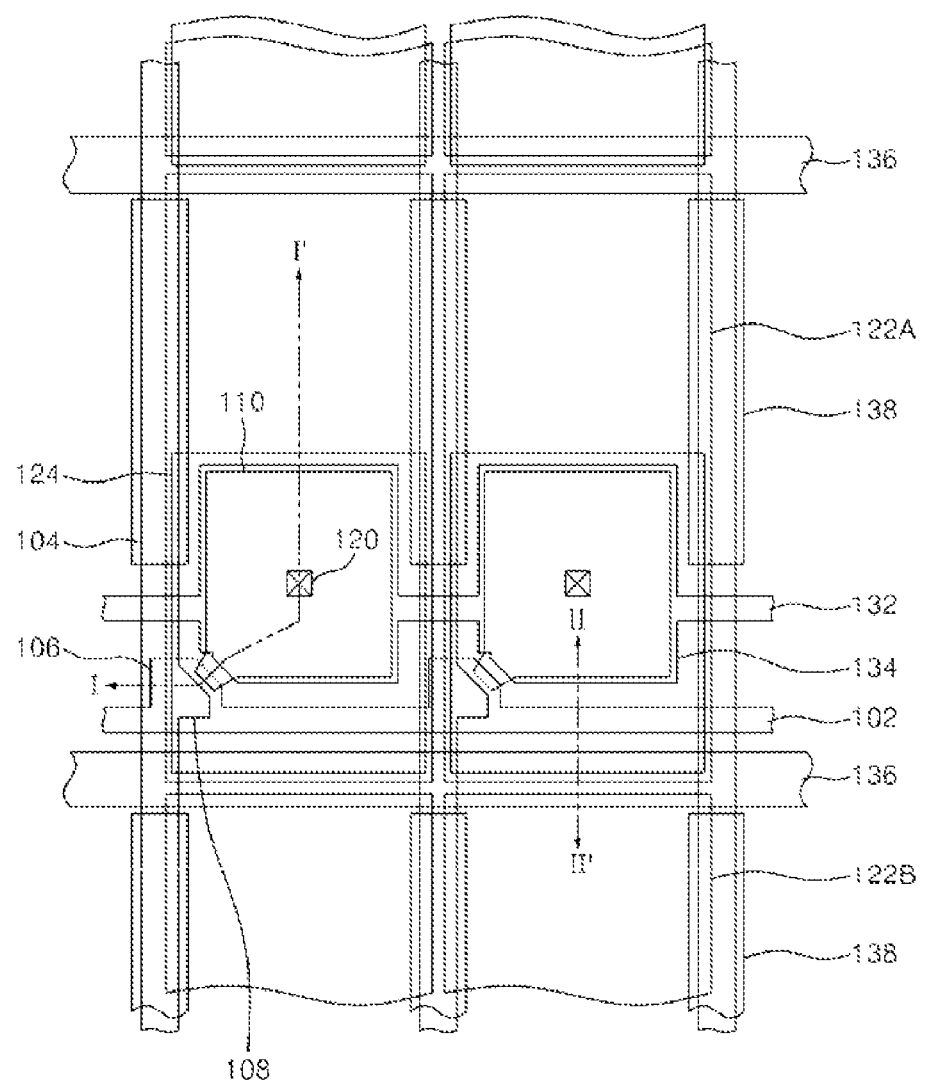
FIG. 2 is a plane view illustrating a TFT substrate of a transflective LCD panel according to an embodiment of the present invention.
Figure 3:
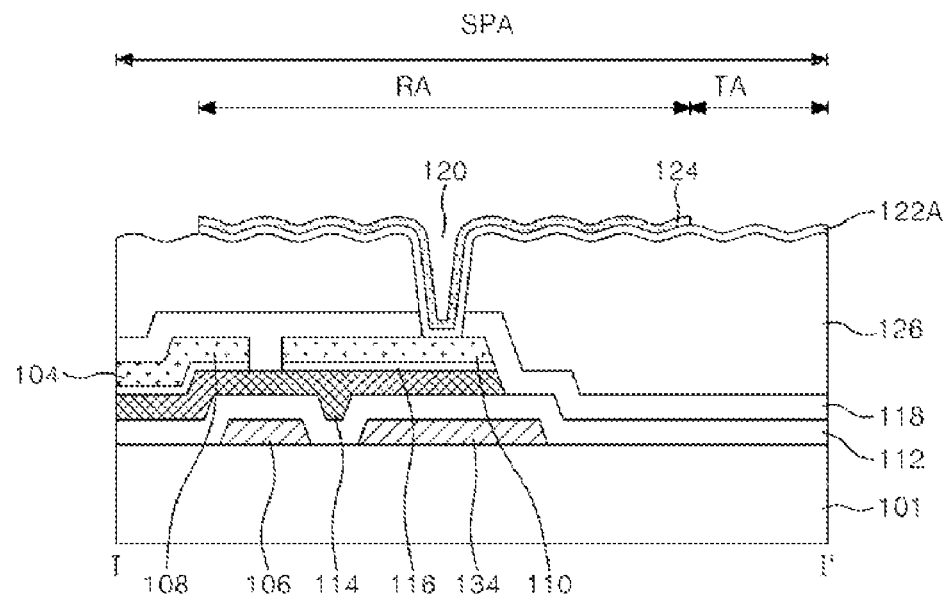
FIG. 3 is a cross-sectional view illustrating the TFT substrate taken along lines I-I' and II-II' in FIG. 2.
Figure 3:
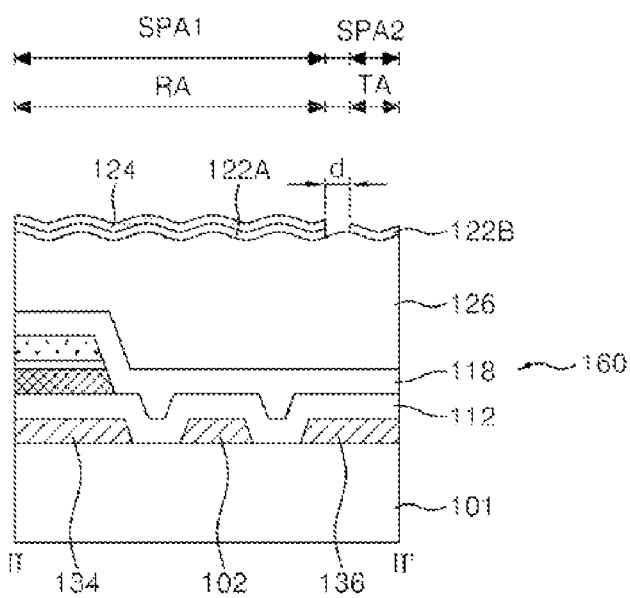

FIGS. 2 and 3 are a plane view and cross-sectional views illustrating a TFT substrate of a transflective LCD device according to an embodiment of the present invention.

Referring to FIGS. 2 and 3, a TFT substrate 160 includes a gate line 102 and a data line 104 that intersect each other, a TFT connected to the gate line 102 and to the data line 104, a pixel electrode 122 formed in each subpixel area SPA, a reflective electrode 124 connected to the TFT, and first and second storage capacitors that maintain the stability of a video signal charged to the pixel electrode. The reflective and pixel electrodes 124 and 122 define a reflective area RA and a transmissive area TA of each subpixel area SPA.

The data line 104 supplies a data signal to the pixel electrode 122 and to the reflective electrode 124 through the TFT. The gate line 102 supplies a gate signal to a gate electrode 106 of the TFT. One side of the gate line 102 is formed to be adjacent to a first storage line 132 and the other side thereof is formed to be adjacent to a second storage line 136.

The TFT includes the gate electrode 106 connected to the gate line 102, an active layer 114 overlapping the gate electrode 106 with a gate insulating layer 112 disposed therebetween, a source electrode 108 connected to the data line 104 and to part of the active layer 114, and a drain electrode 110 connected to another part of the active layer 114. The TFT further includes an ohmic contact layer 116 for ohmic contact between the source electrode 108, the drain electrode 110 and the active layer 114. The gate electrode 106 and the gate line 102 are formed of the same metal on the lower substrate 101. The active layer 114 and the ohmic contact layer 116 are deposited on the gate insulating layer 112, and the source electrode 108 and the drain electrode 110 are formed of the same metal as the data line 104. The source and drain electrodes 108, 110 may be formed on the same plane as the data line 104. The TFT is connected to the pixel electrode 122 and to the reflective electrode 124 through a contact hole 120 penetrating an inorganic passivation layer 118 and an organic passivation layer 126 formed on the TFT. The TFT supplies the data signal of the data line 104 to the pixel electrode 122 and to the reflective electrode 124 in response to the gate signal of the gate line 102.

The pixel electrode 122 is formed on the organic passivation layer 126 of each subpixel area SPA and is connected to the drain electrode 110 through the contact hole 120. The pixel electrode 122 is formed of a transparent conductive material with high transmittance and transmits an internal light from a backlight unit. Video signals of different polarities are charged to adjacent pixel electrodes 122 in up and down directions with the second storage line 136 disposed therebetween (see, e.g., FIG. 2). Therefore, adjacent pixel electrodes 122 may be separated from each other at prescribed intervals so that they do not affect each other. For example, the adjacent pixel electrodes 122 in up and down directions with the second storage line 136 disposed therebetween are separated from each other by about 7 μm to about 20 μm.

The reflective electrode 124 is formed in a reflective area RA of each subpixel area SPA and is connected to the drain electrode 110 through the pixel electrode 122 formed thereunder. An area in which the reflective electrode 124 is formed in each subpixel area SPA is defined as the reflective area RA, and an area in which the reflective electrode 124 is not formed is defined as the transmissive area TA. The reflective electrode 124 is formed of a conductive material with high reflectance and reflects an external light. In order to improve reflective efficiency, the organic passivation layer 126 may have an embossed surface so that the reflective electrode 124 formed thereon also has an embossed surface. Referring to FIG. 2, for example, an outer part of the reflective electrode 124 overlaps a side of the data line 104 and overlap the TFT. Since a channel part of the TFT is protected by the reflective electrode 124, no additional black matrixes are needed. The reflective electrode 124 overlaps the gate line 102 between the first and second storage lines 132 and 136 and overlaps a side of the second storage line 136 adjacent to the gate line 102. Thus, since the gate signal of the gate line 102 is shielded by the reflective electrode 124, an arrangement of liquid crystal molecules is not distorted throughout the entire area of the reflective electrode 124. That is, since the LCD device according to the embodiments of the present invention does not need an additional black matrix for preventing the liquid crystal molecules from being distorted, reflectance is improved. In addition, when the reflectance is maintained constant, the LCD device of the embodiments of the present invention has improved transmittance compared to a conventional LCD device by, for example, about 20% or more. Furthermore, since the LCD device of the embodiments of the present invention can prevent light leakage, flicker caused by the light leakage is prevented.

The first and second storage capacitors maintain the stability of the video signal charged to the pixel electrode 122 until the next signal is charged.

The first storage capacitor is formed such that the drain electrode 110 connected to the pixel electrode 122 overlaps the storage electrode 134 with the gate insulating layer 112 disposed therebetween. The storage electrode 134 protrudes from the first storage line 132.

The second storage capacitor is formed such that the pixel electrode 122 overlaps the second storage line 136 with the gate insulating layer 112, the inorganic passivation layer 118 and the organic passivation layer 126 disposed therebetween. The second storage line 136 is in parallel with the gate line 102 and overlaps the pixel electrodes 122 that are adjacent to each other in up and down directions, that is, in the direction of the data line 104.

The second storage line 136 is separated at given intervals from a shield pattern 138 overlapping the data line 104. Since the shield pattern 138 overlaps the data line 104 with wider width than the data line 104, light leakage between the data line 104 and the pixel electrode 122 can be prevented.

Figure 4:
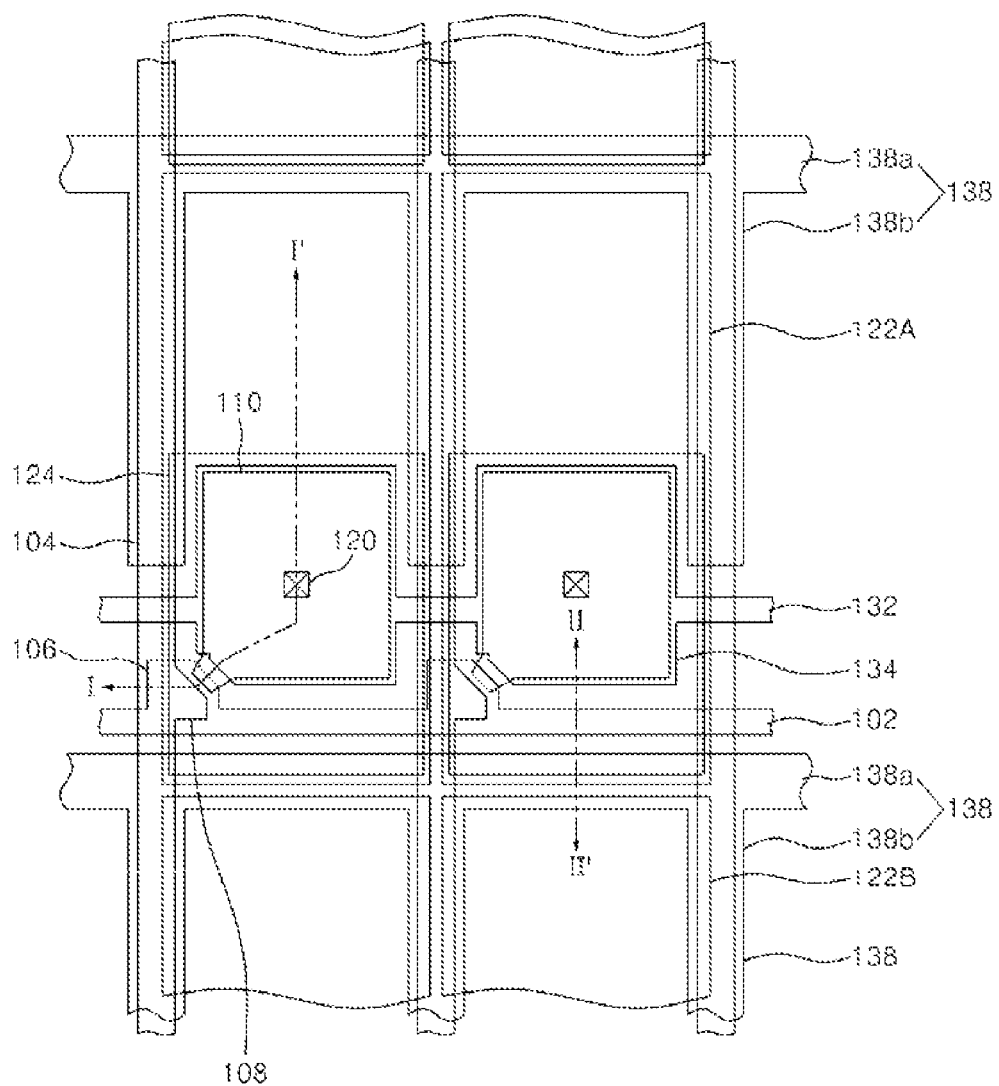
FIG. 4 is a plane view illustrating a TFT substrate of a transflective LCD panel according to an embodiment of the present invention.

The shield pattern 138 may include, as illustrated in FIG. 4, a shield part 138b overlapping the data line 104 and a second storage line part 138a parallel with the gate line 102. The second storage line part 138a and the shield part 138b may be electrically connected to form a united shape. A common voltage that is a reference voltage during the driving of the LCD device or a storage voltage is supplied to the shield pattern 138 through the second storage line part 138a. In this case, the shield pattern 138 prevents light leakage between the data line 104 and the pixel electrode 122 and shields the video signal of the data line 104, thereby suppressing a coupling phenomenon caused by a parasitic capacitance between the data line 104 and the pixel electrode 122.

The area of the second storage line part 138a formed in an electrically united form with the shield part 138b is increased by the shield part 138b. An overlapping area between the second storage line part 138b and the pixel electrode 122 increases the capacitance of the second storage capacitor. As a result, a kickback voltage that is in inverse proportion to the increased capacitance of the second storage capacitor decreases. If the area of the storage electrode 134 decreases, the increased kickback voltage due to the decreased capacitance of the first storage capacitor is reduced by the second storage capacitor.

Figure 5:
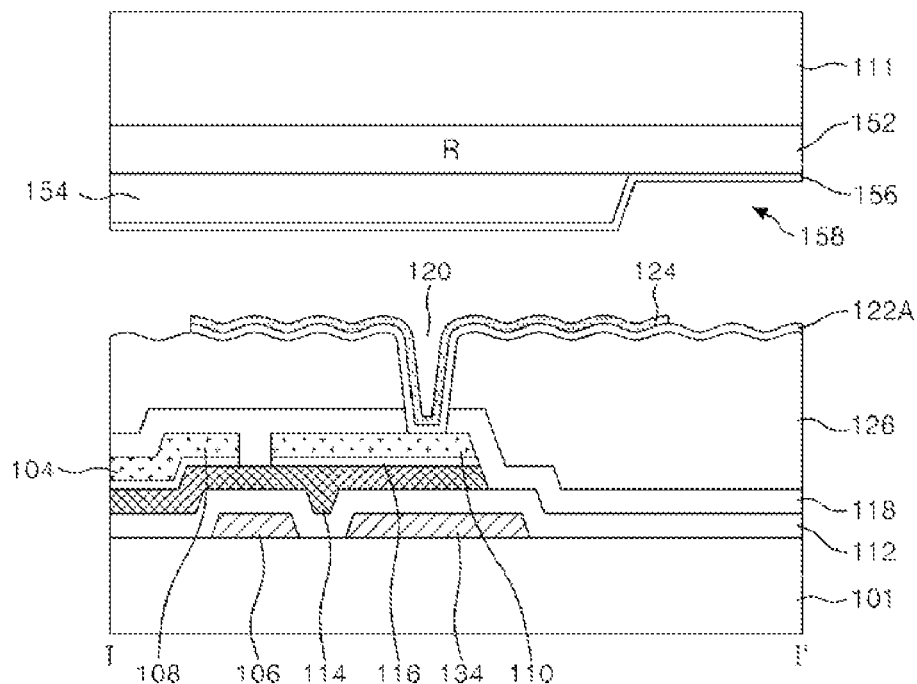
FIG. 5 is a cross-sectional view illustrating the LCD panel including the TFT substrate shown in FIG. 3 and a color filter substrate according to an embodiment of the present invention.
Figure 5:
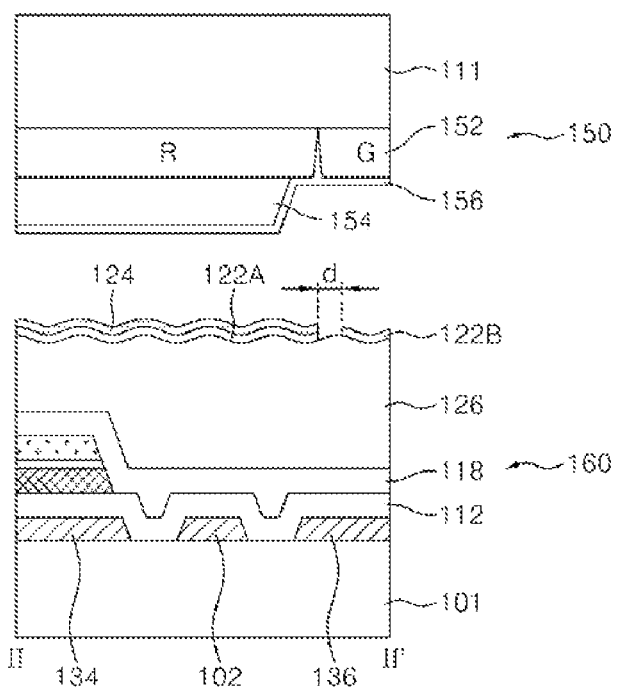

The TFT substrate 160 illustrated in FIG. 3 or 4 is bonded to the color filter substrate 150 including the color filter 152, as shown in FIG. 5. A liquid crystal layer is disposed between the TFT and color filter substrates 160, 150. Referring to FIG. 5, the TFT substrate 160 illustrated in FIG. 3 is bonded to the color filter substrate 150, thereby forming an LCD panel.

The color filter substrate 150 includes the color filter 152 formed on the upper substrate 111, and an overcoat layer 154 and a common electrode 156 deposited on the color filter 152.

The color filter 152 is formed on the upper substrate 111 in ref (R), green (G), and blue (B) subpixel areas SPA to define R, G and B subpixels.

The overcoat layer 154 compensates for a difference in a light path between an external light emitted twice through the liquid crystal layer in the reflective area RA and an internal light emitted once through the liquid crystal layer in the transmissive area TA. To this end, the overcoat layer 154 has a through hole 158 for exposing the color filter 152 in the transmissive area TA. Alternatively, the overcoat 154 has the through hole 158 for penetrating a part of the overcoat 154 in order to compensate for a difference in the light path and to compensate for a stepped difference between the color filters 152.

An end of the overcoat layer 154 overlaps the reflective electrode 124 adjacent to the second storage line 136, and the another end thereof is adjacent to the storage electrode 134 and overlaps the reflective electrode 124. As a result, the arrangement of liquid crystals is similar to an up and down symmetrical structure.

The common electrode 156 comprising, for example, a transparent conductive material is formed on the overcoat layer 154.

FIGS. 6A to 10B are plane views and cross-sectional views illustrating a process of manufacturing a TFT substrate. A process of manufacturing the TFT substrate illustrated in FIG. 2 will be described by way of example.

Figure 6A:
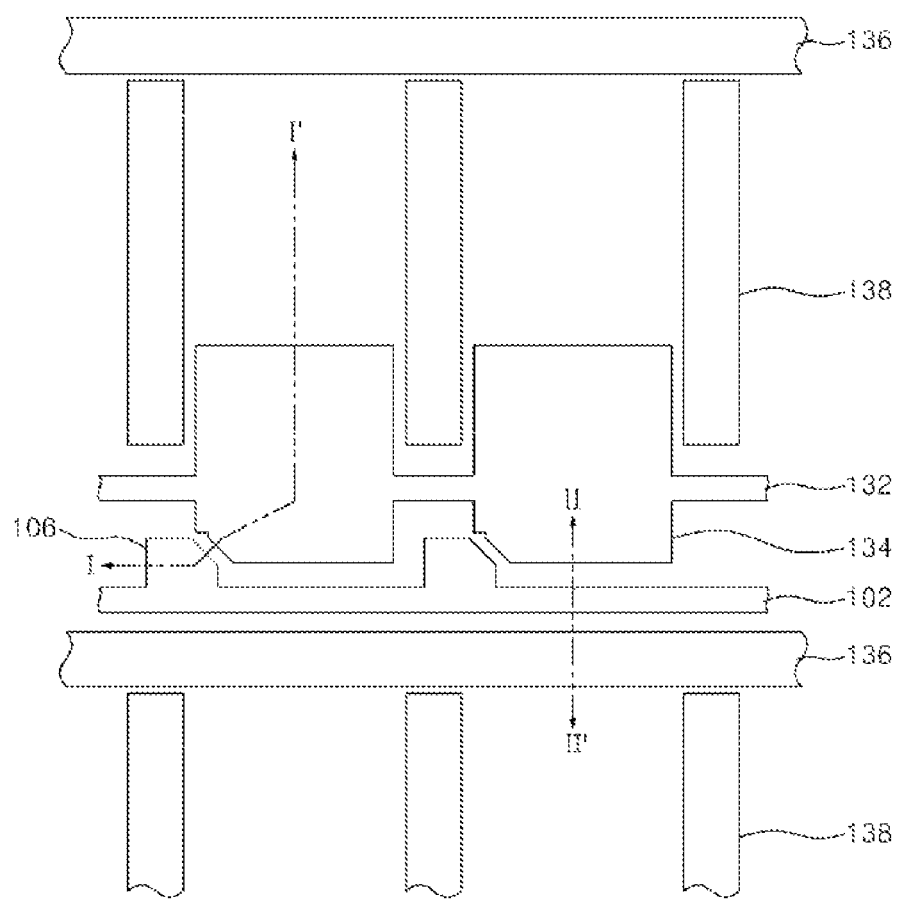
FIGS. 6A and 6B are a plane view and a cross-sectional view for describing a process of manufacturing a first conductive pattern group of a TFT substrate according to an embodiment of the present invention.
Figure 6B:
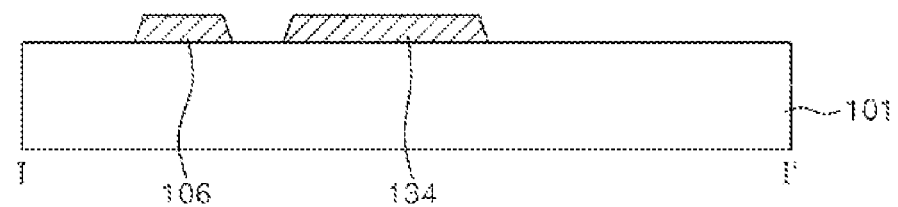
Figure 6B:
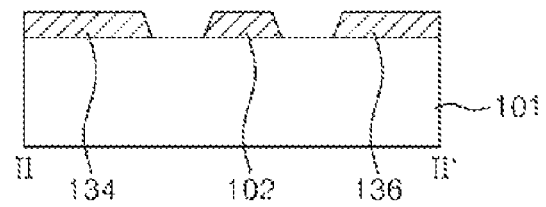

As shown in FIGS. 6A and 6B, a first conductive pattern group, including the gate line 102, the gate electrode 106 connected to the gate line 102, the first and second storage lines 132 and 136 adjacent to the gate line 102, the storage electrode 134 connected to the first storage line 132, and the shield pattern 138 adjacent to the second storage line 136, is formed on the lower substrate 101.

More specifically, a gate metal layer is formed on the lower substrate 101 by a deposition method such as sputtering. The gate metal layer is formed in a single layer structure composed of a metal such as molybdenum (Mo), titanium (Ti), cupper (Cu), aluminum neodymium (AlNd), aluminum (Al), chrome (Cr), Mo alloy, Cu alloy or Al alloy, or in a multi-layered structure composed of a combination of these metals. Next, the gate metal layer is patterned by a photolithography process and an etching process, thereby forming the first conductive pattern group including the gate line 102, the gate electrode 106, the first and second storage lines 132 and 136, the storage electrode 134 and the shield pattern 138.

Figure 7A:
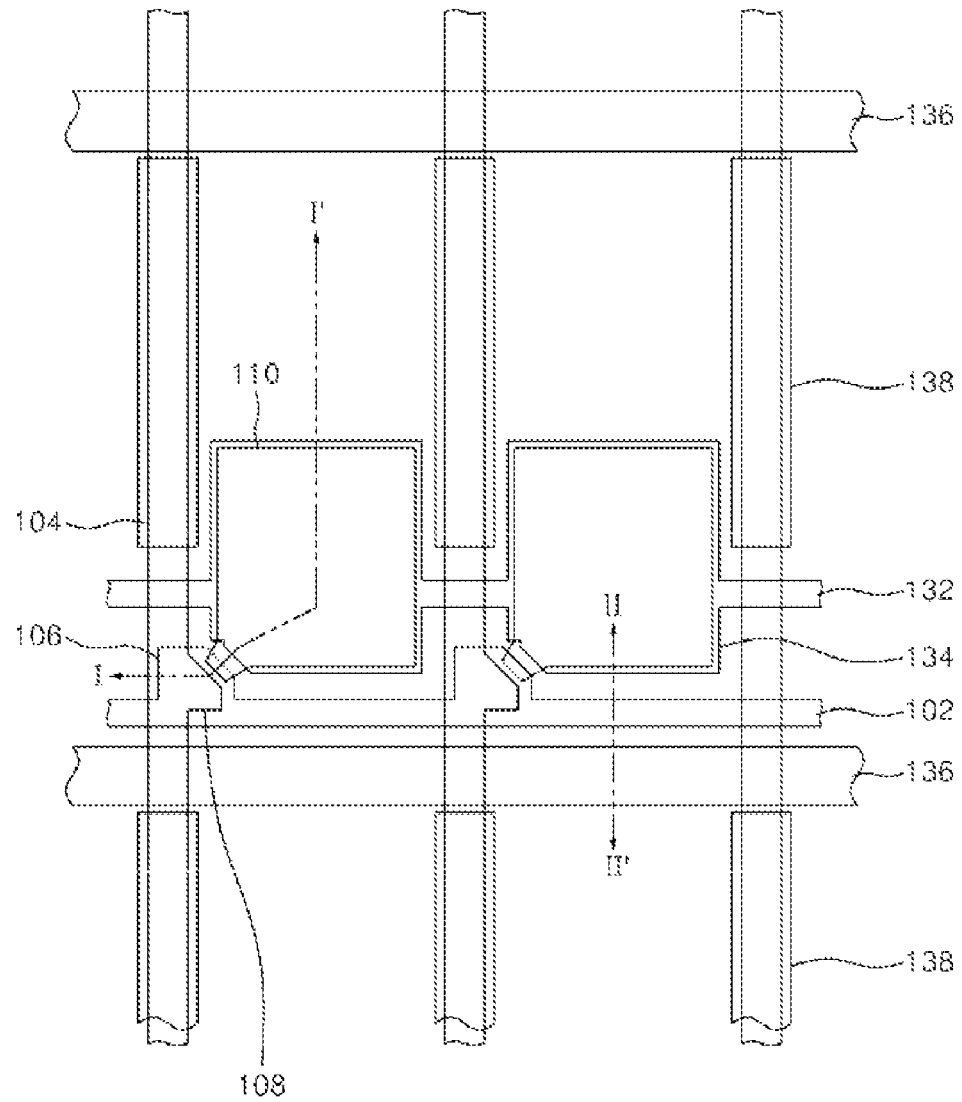
FIGS. 7A and 7B are a plane view and a cross-sectional view for describing a process of manufacturing a second conductive pattern group and a semiconductor pattern group of a TFT substrate according to an embodiment of the present invention.
Figure 7B:
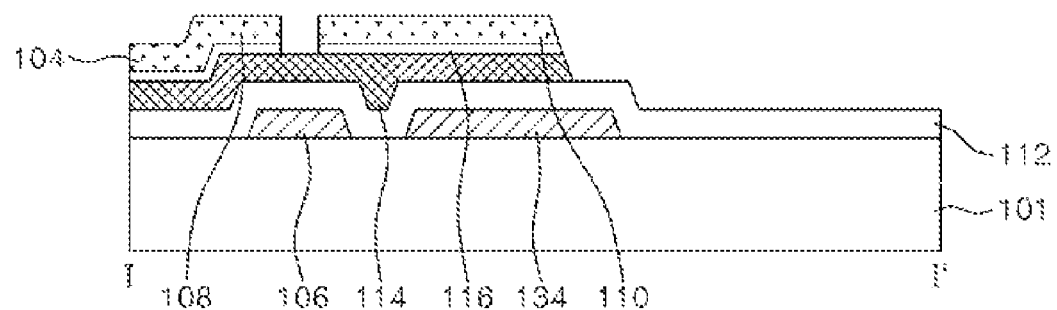
Figure 7B:
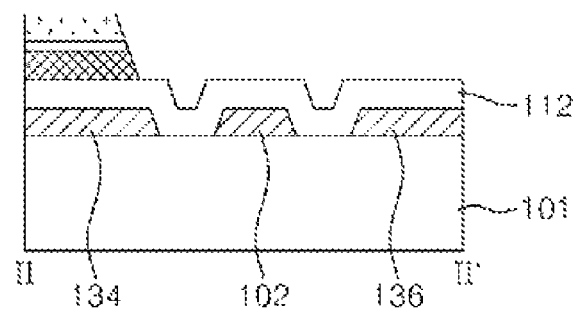

Referring to FIGS. 7A and 7B, the gate insulating layer 112 is formed on the lower substrate 101 on which the first conductive pattern group is formed. A second conductive pattern group, including the data line 104, the source electrode 108 and the drain electrode 110, is formed on the gate insulating layer 112. A semiconductor pattern group, including the active layer 114 and the ohmic contact layer 116 overlapping the second conductive pattern group, is formed under the second conductive pattern group. The semiconductor pattern group and the second conductive pattern group are formed by one mask process using a diffraction exposure mask or a half-tone mask.

Specifically, the gate insulating layer 112, an amorphous silicon layer, an impurity (n+ or p+) doped amorphous silicon layer, and a source/drain metal layer are sequentially formed on the lower substrate 101 on which the first conductive pattern group is formed. An inorganic insulating material such as silicon oxide (SiOx) or silicon nitride (SiNx) is used as the gate insulating layer 112. The source/drain metal layer is formed in a single metal layer structure composed of a metal such as Mo, Ti, Cu, AlNd, Al, Cr, Mo alloy, Cu alloy or Al alloy, or in a multi-layered structure composed of a combination of these metals. A photoresist is deposited on the source/drain metal layer, and the photoresist is exposed and developed by a photolithography process using a different exposure mask, thereby forming first and second photoresist patterns having a step coverage. The first photoresist pattern is located in an area in which the semiconductor pattern group and the second conductive pattern group are to be formed. The second photoresist pattern having a thinner thickness than the first photoresist pattern is located in an area in which the channel of the TFT is to be formed. The second conductive pattern group, and the semiconductor pattern group under the second conductive pattern group are formed by patterning the source/drain metal layer by an etching process using the photoresist patterns. The source electrode 108 and the drain electrode 110 of the second conductive pattern group are electrically connected to each other.

The thickness of the first photoresist pattern is reduced by an ashing process using oxygen ($O_2$) plasma, and the second photoresist pattern is removed. By an etching process using the ashed first photoresist pattern, the second conductive pattern group exposed by removing the second photoresist pattern, and the ohmic contact layer 116 under the second conductive pattern group are removed, thereby separating the source electrode 108 and the drain electrode 110 from each other and exposing the active layer 114.

The first photoresist pattern remaining on the source/drain metal pattern is removed by a strip process.

Figure 8A:
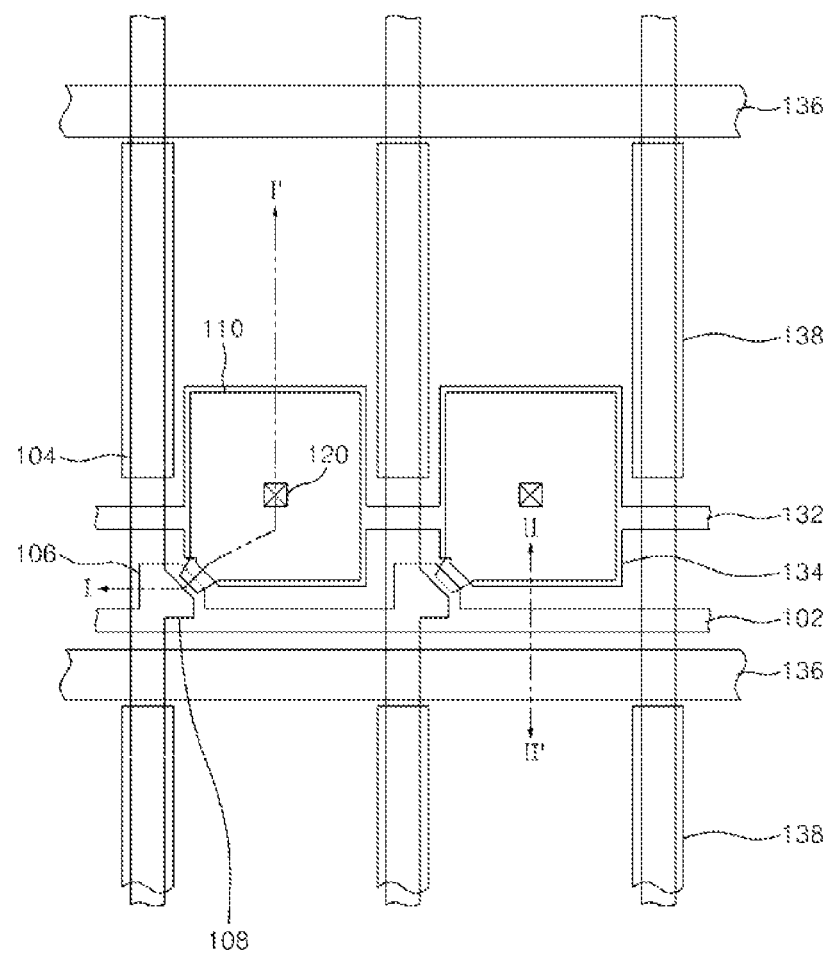
FIGS. 8A and 8B are a plane view and a cross-sectional view for describing a process of manufacturing an inorganic passivation layer and an organic passivation layer of a TFT substrate according to an embodiment of the present invention.
Figure 8B:
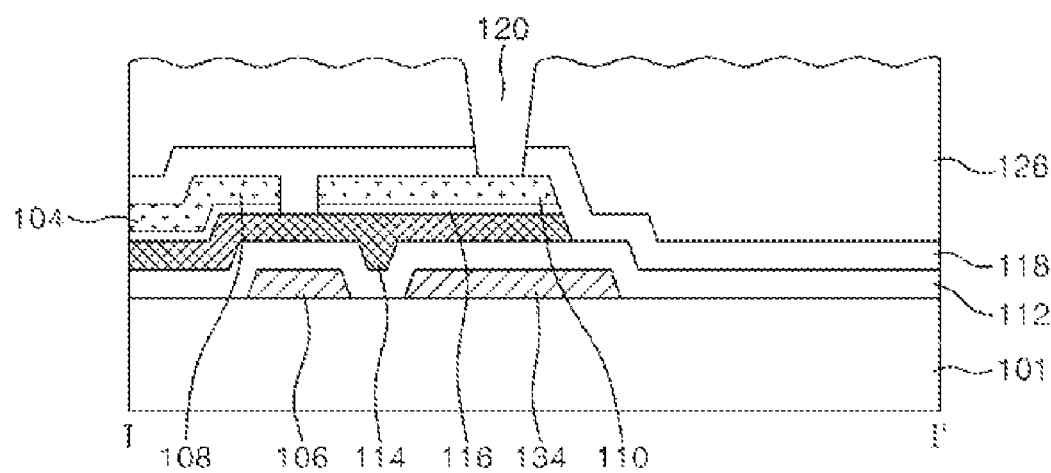
Figure 8B:
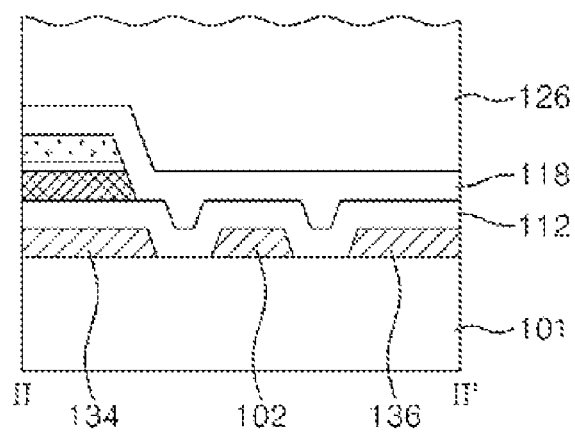

Referring to FIGS. 8A and 8B, the inorganic passivation layer 118 is formed on the gate insulating layer 112 on which the second conductive pattern group is formed. Next, the organic passivation layer 126 having an embossed surface is formed on the inorganic passivation layer 118.

More specifically, the inorganic passivation layer 118 is formed on the gate insulating layer 112 on which the second conductive pattern group is formed. The inorganic passivation layer 118 may be formed of the same inorganic insulating material as the gate insulating layer. The organic passivation layer 126 having an embossed surface is formed on the inorganic passivation layer 118. The organic passivation layer 126 comprises a resin including, for example, an alkali-soluble group, a photoactive compound (PAC), a solvent, and an additive (for example, an adhesion promoter or surfactant). By patterning the inorganic passivation layer 118 and the organic passivation layer 126 by a photolithography process and an etching process, the contact hole 120 exposing the drain electrode 110 by penetrating the inorganic passivation layer 118 and the organic passivation layer 126 is formed.

Figure 9A:
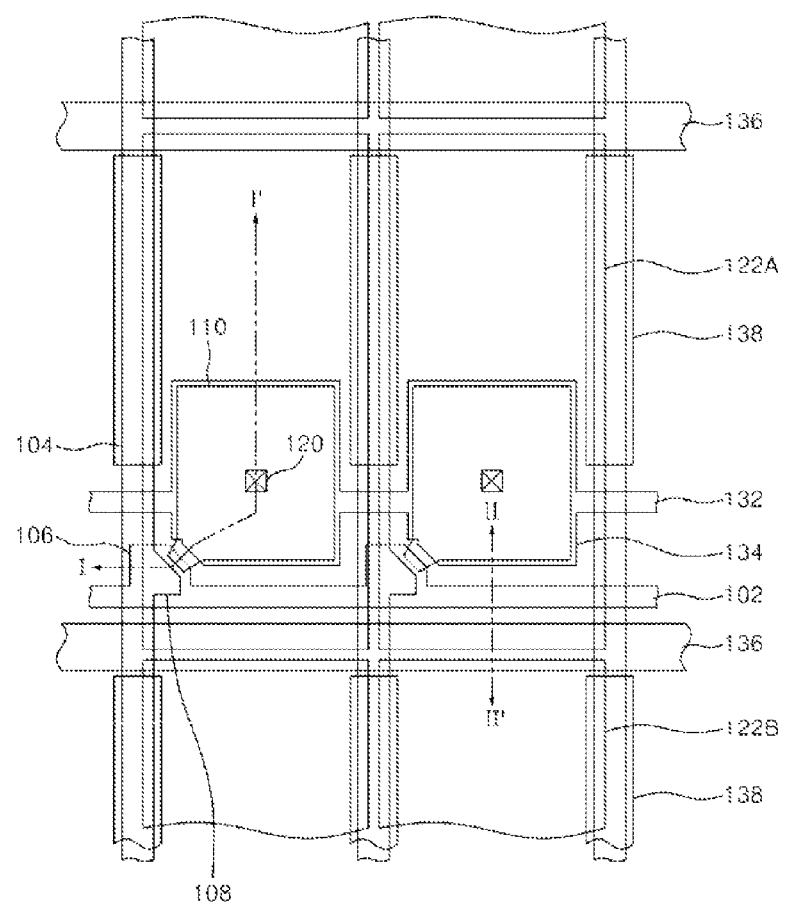
FIGS. 9A and 9B are a plane view and a cross-sectional view for describing a process of manufacturing a third conductive pattern group of a TFT substrate according to an embodiment of the present invention.
Figure 9B:
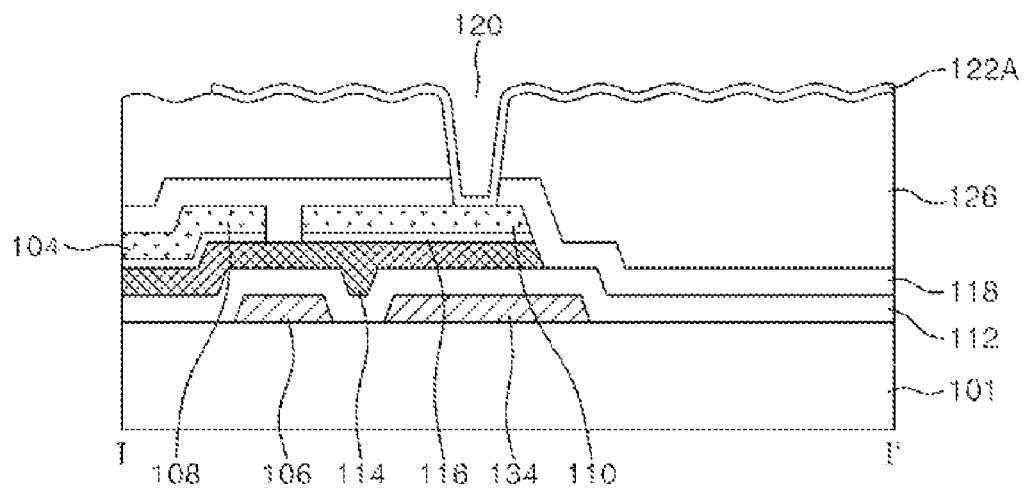
Figure 9B:
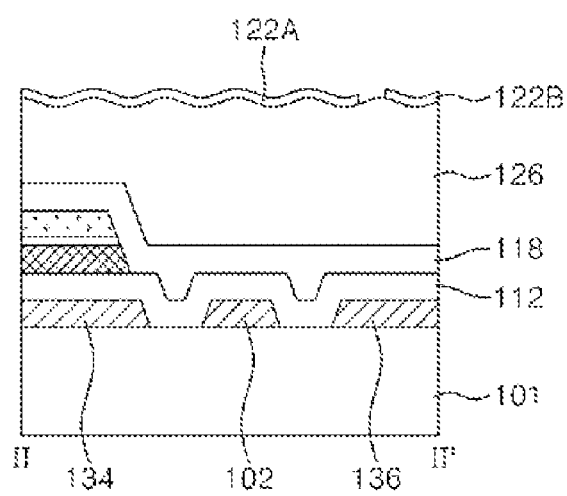

Referring to FIGS. 9A and 9B, a third conductive pattern group including a pixel electrode is formed on the organic passivation layer 126.

More specifically, a transparent conductive layer is formed on the organic passivation layer 126 by a deposition method such as sputtering to keep an embossed shape. The pixel electrode 122 is formed in each subpixel area by patterning the transparent conductive layer by a photolithography process and an etching process. The pixel electrode 122 is connected to the drain electrode 110 through the contact hole 120. As he transparent conductive layer, for example, tin oxide (TO), indium tin oxide (ITO), indium zinc oxide (IZO), or indium tin zinc oxide (ITZO) may be used.

Figure 10A:
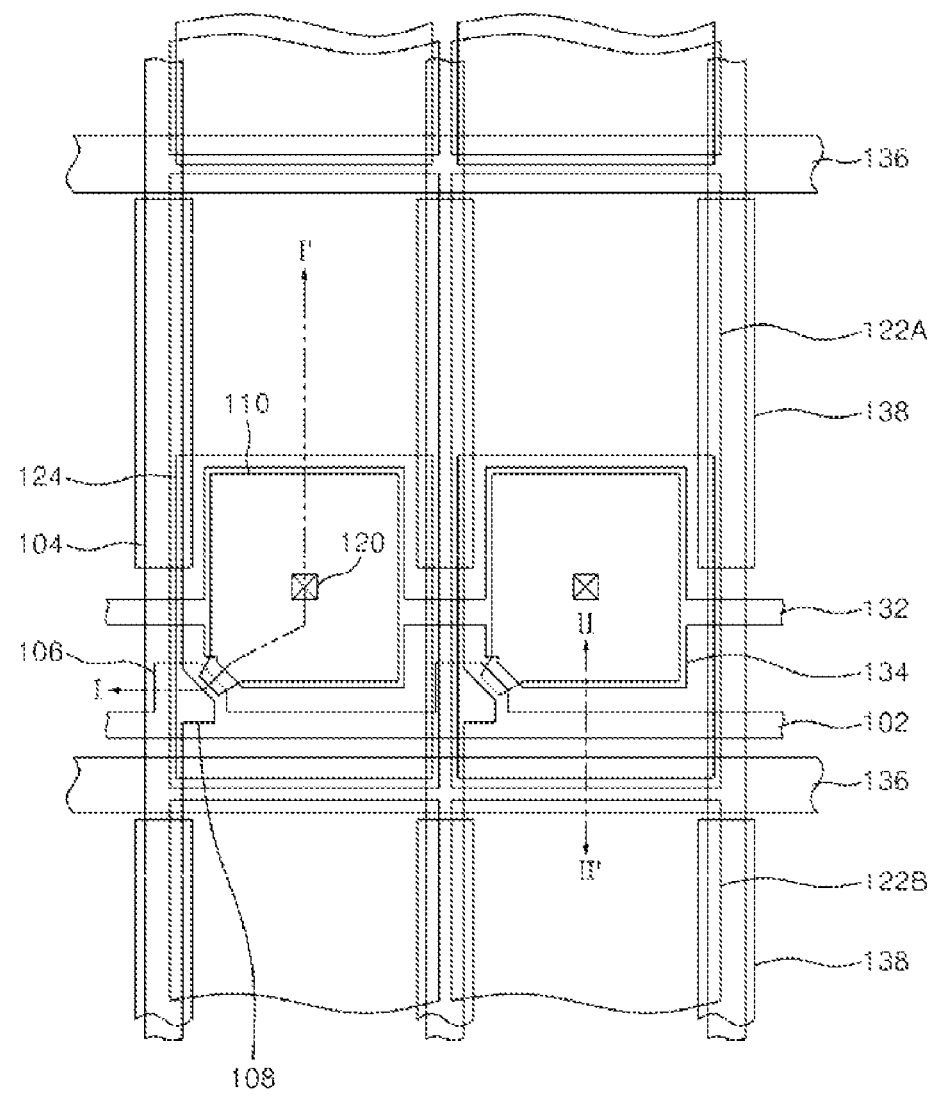
FIGS. 10A and 10B are a plane view and a cross-sectional view for describing a process of manufacturing a fourth conductive pattern group of a TFT substrate according to an embodiment of the present invention.
Figure 10B:
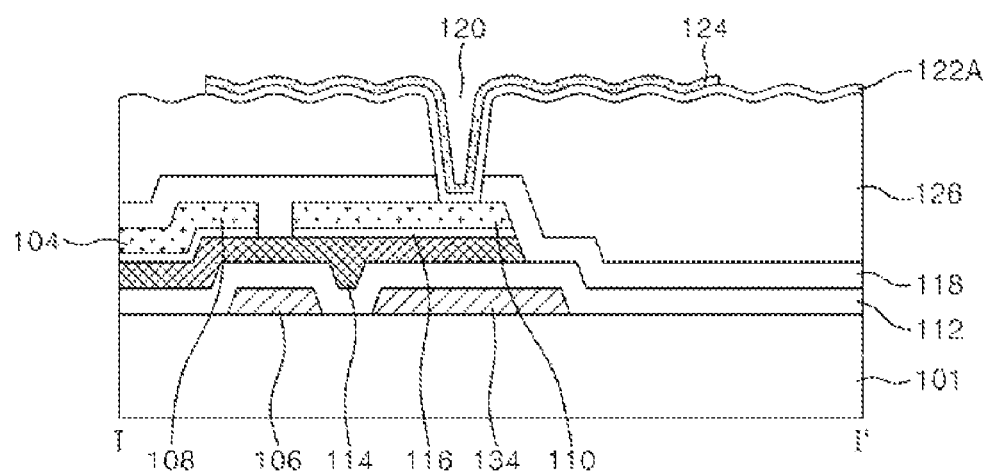
Figure 10B:
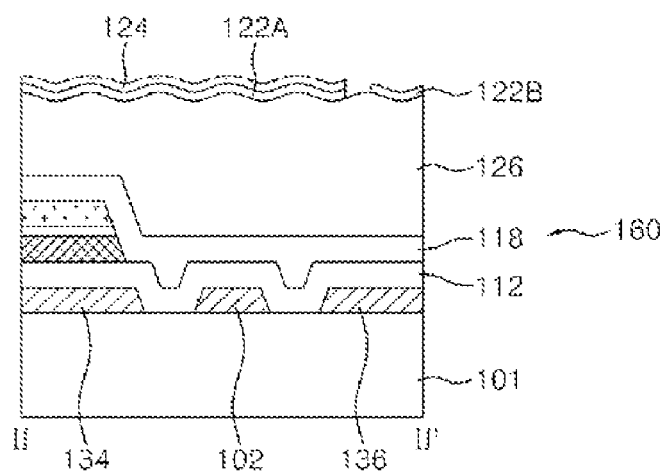

Referring to FIGS. 10A and 10B, a fourth conductive pattern group including the reflective electrode 124 is formed on the third conductive pattern group.

More specifically, while maintaining an embossed shape, a reflective metal layer is deposited on the organic passivation layer 126 on which the pixel electrode 122 is formed. A metal with high reflectance such as Al or AlNd is used as the reflective metal layer. The fourth conductive pattern group including the reflective electrode 124 is formed in each subpixel area by patterning the reflective metal layer by a photolithography process and an etching process.

While the embodiments of the present invention have been applied to a transflective LCD device, they are not limited thereto, and may be, for example, applicable to a reflective LCD device. The second storage line may overlap the reflective electrode. In addition, while the reflective electrode has been described as being formed on the pixel electrode, it is possible to form the pixel electrode on the reflective electrode or form the pixel and reflective electrodes on the same layer.

As described above, the TFT substrate and the LCD device including the same according to embodiments of the present invention have the gate line covered by the reflective electrode. Therefore, an uneven arrangement of the liquid crystals occurring at the edge of the reflective electrode caused by the gate signal can be presented. As a result, flicker can be prevented and a reflective rate is improved.

Moreover, since the TFT substrate and the LCD device including the same according to embodiments of the present invention prevent light leakage by using the reflective electrode, the storage line and the shield pattern, no additional black matrixes are needed. As a result, because a mask process for forming the black matrixes is unnecessary, a manufacturing process is simplified and a manufacturing cost is reduced. Also, yield and an aperture ratio are improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:
1. A liquid crystal display panel, comprising:
    a first substrate including a plurality of gate lines, a plurality of data lines, a plurality of thin film transistors each of which is connected to a corresponding gate line of the gate lines and a corresponding data line of the data lines, and a plurality of reflective electrodes each of which is connected to a corresponding thin film transistor of the thin film transistors, wherein the reflective electrodes covers at least part of the gate lines;
    a plurality of pixel electrodes each of which is connected to a corresponding thin film transistor of the thin film transistors;
    a second substrate facing the first substrate and including a plurality of color filters and a common electrode forming an electric field with the reflective electrodes and the pixel electrodes;
    a shield pattern on the first substrate to overlap with the data lines and to prevent light leakage between the data lines and the pixel electrodes;

a plurality of second storage lines each of which overlaps with at least two pixel electrodes adjacent to each other in a direction of a length of the data lines; and liquid crystals disposed between the first substrate and the second substrate, wherein the data lines overlap a space between two pixel electrodes adjacent to each other and a width of the shield pattern is wider than a width of each data line.

2. The liquid crystal display panel according to claim 1, further comprising an overcoat layer, wherein the overcoat layer includes a first end and a second end overlapping with the reflective electrodes.

3. The liquid crystal display panel according to claim 1, further comprising:

a plurality of storage electrodes overlapping with drain electrodes of the thin film transistors, wherein an insulating layer is formed between the storage electrodes and the drain electrodes and the storage electrodes and the drain electrodes form first storage capacitors;

a plurality of first storage lines each of which is connected to a corresponding storage electrode of the storage electrodes and adjacent to a first end of an adjacent gate line; and wherein each second storage line is adjacent to a second end of an adjacent gate line and forms a second storage capacitor with a pixel electrode of the pixel electrodes.

4. The liquid crystal display panel according to claim 1, further comprising:

a plurality of storage electrodes insulatedly overlapping with drain electrodes of the thin film transistors, wherein an insulating layer is formed between the storage electrodes and the drain electrodes and the storage electrodes and the drain electrodes form first storage capacitors;

a plurality of first storage lines each of which is connected to a corresponding storage electrode of the storage electrodes and adjacent to a first end of an adjacent gate line; and a plurality of second storage lines insulatedly overlapping with the pixel electrodes, wherein an insulating layer is formed between the second storage lines and the pixel electrodes, and each second storage line is adjacent to a second end of an adjacent gate line and forms a second storage capacitor with a pixel electrode of the pixel electrodes;

wherein the shield pattern is electrically connected to the second storage lines.

5. A thin film transistor substrate, comprising:

a plurality of gate lines formed on a substrate;

a plurality of data lines crossing the gate lines, wherein the data lines are insulated from the gate lines;

a plurality of thin film transistors connected to the gate lines and data lines;

a plurality of pixel electrodes connected to the thin film transistors;

a shield pattern on the substrate to overlap with the data lines and to prevent light leakage between the data lines and the pixel electrodes;

a plurality of second storage lines each of which overlapping with at least two pixel electrodes adjacent to each other in a direction of a length of the data lines; and a plurality of reflective electrodes connected to the thin film transistors and covering at least a portion of the gate lines, wherein the data lines overlap a space between two pixel electrodes adjacent to each other and a width of the shield pattern is wider than a width of the data lines.

6. The thin film transistor substrate according to claim 5, further comprising:

a plurality of storage electrodes overlapping drain electrodes of the thin film transistors, wherein an insulating layer is formed between the storage electrodes and the drain electrodes and the storage electrodes and the drain electrodes form first storage capacitors;

a plurality of first storage lines connected to the storage electrodes and adjacent to a first end of the gate lines; and wherein an insulating layer is formed between the second storage lines and the pixel electrodes, and the second storage lines are adjacent to a second end of the gate lines and forms second storage capacitors with the pixel electrodes.

7. The thin film transistor substrate according to claim 5, further comprising:

a plurality of storage electrodes overlapping drain electrodes of the thin film transistors, wherein an insulating layer is formed between the storage electrodes and the drain electrodes and the storage electrodes and the drain electrodes form first storage capacitors; and a plurality of first storage lines connected to the storage electrodes and adjacent to a first end of the gate lines; and wherein an insulating layer is formed between the second storage lines and the pixel electrodes, and the second storage lines are adjacent to a second end of the gate lines and form second storage capacitors with the pixel electrodes;

wherein the shield pattern is electrically connected to the second storage lines.

8. The thin film transistor substrate according to claim 6, wherein the second storage lines are located between two pixel electrodes to which data signals having different polarities are supplied.

* * * * *